(12) United States Patent
DenBraber

(10) Patent No.: US 7,039,893 B2
(45) Date of Patent: May 2, 2006

(54) SYSTEM AND METHOD FOR IMPLEMENTING CONFIGURABLE FINITE STATE MACHINE

(75) Inventor: Lee Roger DenBraber, Fort Wayne, IN (US)

(73) Assignee: Carrier Corporation, Farmington, CT (US)

( * ) Notice: Subject to any disclaimer, the term of this patent is extended or adjusted under 35 U.S.C. 154(b) by 377 days.

(21) Appl. No.: 10/166,924

(22) Filed: Jun. 11, 2002

(65) Prior Publication Data

US 2004/0003355 A1   Jan. 1, 2004

(51) Int. Cl.
*G06F 17/50* (2006.01)
(52) U.S. Cl. ............................................. 716/16; 716/4
(58) Field of Classification Search .................. 716/16, 716/4
See application file for complete search history.

(56) References Cited

U.S. PATENT DOCUMENTS

| | | | | |
|---|---|---|---|---|
| 4,622,538 | A | * | 11/1986 | Whynacht et al. .......... 340/506 |
| 5,363,493 | A | * | 11/1994 | Unverrich ..................... 714/47 |
| 5,459,841 | A | * | 10/1995 | Flora-Holmquist et al. ... 326/37 |
| 5,943,408 | A | * | 8/1999 | Chen et al. ............. 379/216.01 |
| 6,097,988 | A | | 8/2000 | Tobias |
| 6,138,171 | A | * | 10/2000 | Walker ........................ 719/318 |
| 6,202,170 | B1 | * | 3/2001 | Busschbach et al. .......... 714/11 |
| 6,292,841 | B1 | * | 9/2001 | Mason et al. ............... 719/318 |

OTHER PUBLICATIONS

Fecko et al., "Efficient Test Generation For Army Network Protocols with Conflicting Times", IEEE, Dec. 2000.*
"A Finite State Machine Decision Algorithm", John Wiese, Alpha Design Corp., San Jose, CA—We have no publication information for this paper but to the best of our knowledge it came from an Embedded Systems Conference some years ago but at least one year prior to the present application.

* cited by examiner

*Primary Examiner*—Vuthe Siek
*Assistant Examiner*—Brandon Bowers
(74) *Attorney, Agent, or Firm*—Wall Marjama & Bilinski LLP

(57) ABSTRACT

A configurable FSM engine generates specific configurations for different state machines based on configuration data using a common method. A common configuration structure is used for all state machine implementations. Changes in the state machine design drive changes in the configuration data instead of in executable software. Multiple software state machines are thus implemented using a configurable approach. In addition, state machine processing is performed periodically and state transition events are handled without the need for an event driven operating system.

18 Claims, 14 Drawing Sheets

Design 1

Design 2

Design 1

Design 2

SYSTEM AND METHOD FOR IMPLEMENTING CONFIGURABLE FINITE STATE MACHINE

FIELD OF THE INVENTION

This invention relates generally to the field of computer software, and more particularly to a configurable finite state machine.

BACKGROUND OF THE INVENTION

A finite state machine (FSM) is a device that stores the status of something at a given time and operates on input to change the status and/or cause an action or output to take place based on the input. An FSM is typically implemented in either hardware or software, or a combination of the two. An example of a hardware implementation is a digital logic circuit that controls the operation of a vending machine. Putting the right amount of money into the machine and pressing a button causes an item to be vended and change returned if required. The digital logic circuit can be implemented entirely in hardware using logic chips and circuits. An example of a software implementation for a vending machine is a microcontroller that is programmed to detect inputs, such as how much money is deposited and which buttons are pushed, and provide an output to control the release of a product and provide change. In either implementation, the design process starts with designing an FSM that shows all the possible states of the process along with the inputs and outputs of each state.

A computer or other programmable device is a state machine in which each machine instruction causes the status of the device to move from one state to another. In general, a programmer develops a state machine diagram and then writes specific software to implement the FSM corresponding to that design. A design change requires new software to implement the new FSM corresponding to the changed design.

SUMMARY OF THE INVENTION

Briefly stated, a configurable FSM engine generates specific configurations for different state machines based on configuration data using a common method. A common configuration structure is used for all state machine implementations. Changes in the state machine design drive changes in the configuration data instead of in executable software. Multiple software state machines are thus implemented using a configurable approach. In addition, state machine processing is performed periodically and state transition events are handled without the need for an event driven operating system.

According to an embodiment of the invention, a method for implementing a configurable state machine includes the steps of determining a state machine diagram for a desired state machine; allocating a RAM variable for an input word; assigning transition condition bits in the input word; implementing an input word processing function; allocating a state machine workspace structure in RAM; configuring the state machine by creating a list of states and corresponding constant values and allocating and populating a state machine configuration structure; calling, at initialization, a configurable state machine initialization function passing an address of the state machine configuration; and calling periodically a configurable state machine processing function passing the address of the state machine configuration.

According to an embodiment of the invention, a method for implementing a configurable state machine includes the steps of determining a state machine diagram for a desired state machine; generating configuration data based on the state machine diagram; and feeding the configuration data to the configured configurable state machine to obtain implementation of the desired state machine.

According to an embodiment of the invention, in an article of manufacture including a computer useable medium having computer readable program code means embodied therein for causing implementation of a configurable state machine, the computer readable program code means in the article of manufacture including first computer readable program code means for causing a computer to effect generation configuration data based on based on a state machine diagram corresponding to a desired state machine; and second computer readable program code means for causing a computer to effect feeding the configuration data to the configured configurable state machine to obtain implementation of the desired state machine.

According to an embodiment of the invention, a program storage device readable by a machine, tangibly embodying a program of instructions executable by a machine to perform method steps for implementing a configurable state machine, the method steps including generating configuration data based on a state machine diagram corresponding to a desired state machine; and feeding the configuration data to the configured configurable state machine to obtain implementation of the desired state machine.

DETAILED DESCRIPTION OF THE PREFERRED EMBODIMENT

Figure 1:
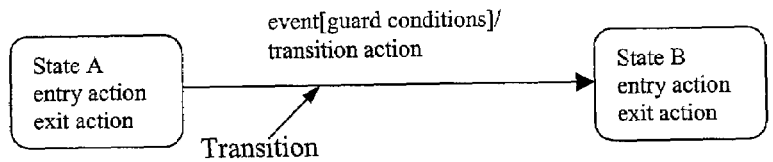
FIG. 1 shows a generic basic state machine diagram.

A finite state machine (FSM) engine is based on Unified Modeling Language (UML) statecharts. A simple state diagram is shown in FIG. 1. Pursuant with UML statecharts, a state is defined by an entry action, exit action, and activity function. In addition, a transition is defined by an event, transition guard conditions, and a transition action. FIG. 1 shows these items in a generic sense, e.g., "entry action" is shown instead of the actual entry action of each state. FIGS. 2–5 are used to show examples of states A and B as well as transitions. For convenience, examples of functions, data types, etc. are stated in the programming language "C" and its variants.

A state is a state of existence that persists for a significant period of time, which is both distinguishable from other states and disjoint with them. A state's activity defines what to do while in a state. A state's exit action defines what to do when leaving the state (i.e., a transition is about to occur). A state's entry action defines what to do when entering the state (i.e. a transition just occurred).

A transition, i.e., a state of existence that persists for a very short period of time compared to a state, is the response to an event that causes a change of states. A transition action defines what to do when a transition occurs. A transition is caused by an event where an event is typically thought of a momentary occurrence. When a transition's event occurs, the transition guard conditions are provided as an additional check to see if the transition should occur.

Figure 2:
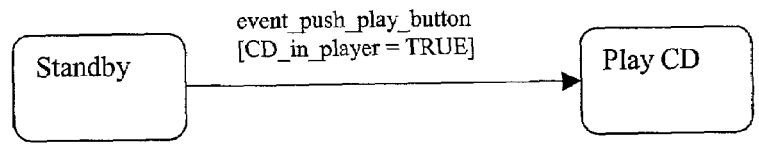
FIG. 2 shows an example of a basic state machine diagram.

For example, referring to FIG. 2, consider a portion of a music CD player state machine. For simplicity, this diagram does not show state entry actions or state exit actions. In this example, the event of pushing the play button causes the CD player to play a CD. However, the transition won't happen unless the transition guard condition of making sure there is a CD in the player is satisfied. Phrased differently, the CD player is in State A, standby, until the event of pushing the play button causes the transition to State B, playing the CD, as long as there is a CD in the CD player, the guard condition.

In pure UML state theory, a state's activity is a behavior that can take a significant amount of time so it is generally interruptible. In addition, actions (i.e., entry, exit, and transition actions) take essentially zero time to execute and are non-interruptible.

To implement a FSM engine that supports persistent, interruptible state activities and that supports non-interruptible actions would require the use of a preemptive real-time operating system. The FSM engine is designed so both state activities and actions are implemented as function calls. In addition, some sort of event buffering/processing mechanism would need to be implemented to implement a truly event driven FSM engine (e.g., using an event driven real-time operating system). However for simplicity, the FSM engine is not designed to be completely event driven.

Figure 3:
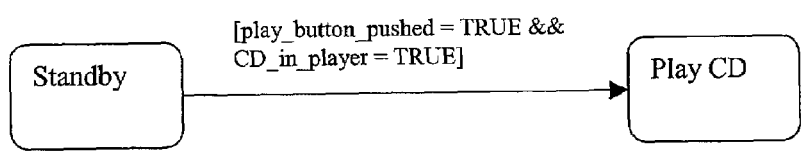
FIG. 3 shows an example of a basic state machine diagram.

The FSM engine is designed to process state machines periodically in a periodic task or loop. In effect, the event that causes transitions is the periodic FSM process function call. Transition guard conditions are checked during each FSM process function call and a transition occurs if the transition guard conditions are satisfied. FIG. 3 shows how to represent the CD player example using the FSM engine. Note that there is no event shown and the two transition guard conditions are logically ANDed together.

Figure 4:
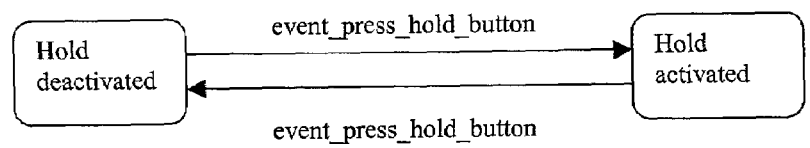
FIG. 4 shows an example of a basic state machine diagram.

The fact that guard conditions are checked causes an interesting effect that must be considered. To explore the effect, let's look at an example of a telephone hold button. When talking on the phone and the hold button is pressed but not held down, a hold is activated. When it is pressed again, it is deactivated. When talking on the phone and the hold button is pressed and held down, a hold is activated, but the hold button has to be released and pressed again to deactivate the hold. A state diagram of this is shown in FIG. 4 assuming an event based state machine. If this state machine is in the "Hold deactivated" state and a "press hold button" event occurs, it will transition to the "Hold activated" state and remain there until another "press hold button" event occurs (i.e., the hold button is released and pressed again).

Figure 5:
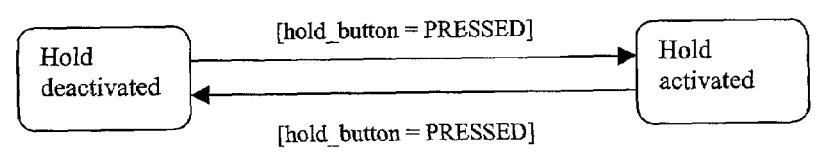
FIG. 5 shows an example of a basic state machine diagram.
Figure 6:
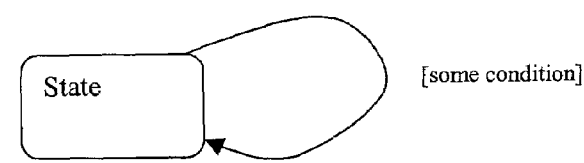
FIG. 6 shows an example of a basic state machine diagram showing a transition from one state to itself.

FIG. 5 shows the same system based on the FSM engine. If the hold button is pressed and held down, the state machine will transition each time the state machine is processed. That is, it will "race" back and forth between "Hold deactivated" and "Hold activated." In most cases this effect does not cause a problem as there seem to be few situations where the same event causes a transition back and forth between two states. However, the FSM engine supports transitions to the same state as shown generically in FIG. 6.

Figure 7:
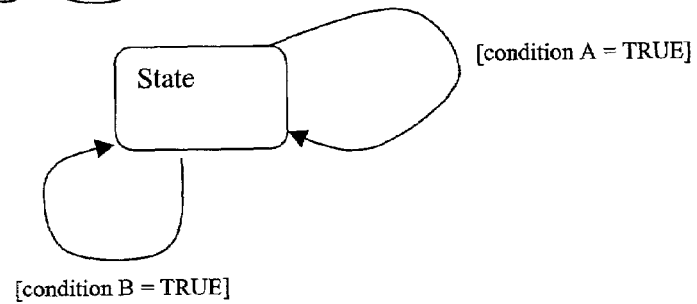
FIG. 7 shows an example of a basic state machine diagram used in explaining a race situation.

The FSM engine avoids "race" situations by handling transitions to the same state differently than transitions to other states in order to support transitions to the same state. The FSM engine prevents "race" situations by not allowing the same condition to cause a transition if the last transition was to the same state. For example, referring to FIG. 7, if "condition A" is true when the state machine is processed, then the associated "condition A" transition occurs. However, if "condition A" is still true the next time the state machine is processed, the "condition A" transition does not occur. If "condition B" is true at some future time when the state machine is processed, then the associated "condition B" transition occurs because the last transition was the "transition A" transition, and if "condition A" becomes true again at some future time (after the "condition B" transition occurred) when the state machine is processed, then the associated "condition A" transition occurs because the last transition was the "transition B" transition.

Each time a state machine is processed, the FSM engine executes the current state's activity function and evaluates all of the current state's transitions (out of the state) to see if it is time to transition. If it is time to take a transition, then the following occurs during this process call:

(a) execute the current state's exit action, (b) execute the transition action of the transition being taken, and (c) set the state to the new state.

The very next time the state machine is processed, the FSM engine executes the new state's entry action function before executing the new state's activity function.

A transition occurs when its associated transition condition expression evaluates to TRUE. A transition condition expression consists of one or more transition conditions logically ANDed together where each transition condition is a binary condition (e.g. TRUE/FALSE, ON/OFF, HIGH/LOW, etc.). The transition conditions are communicated to a state machine using what is called an input word. Each state machine has a unique input word. In this embodiment, an input word is a 32 bit variable where each bit represents a single transition condition. The location for each transition condition bit is determined by an arbitrary bit position selection.

Figure 8:
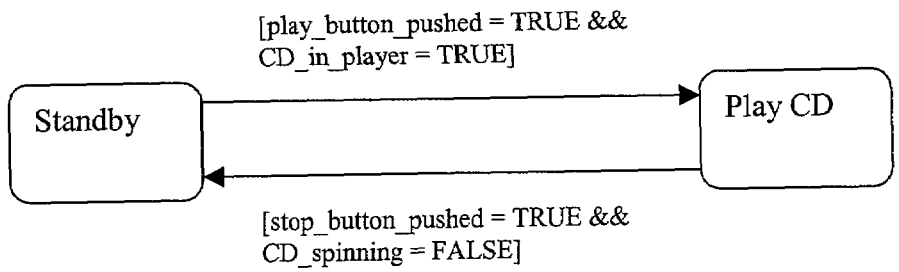
FIG. 8 shows an example of a basic state machine diagram showing four transition conditions.

For example, referring to FIG. 8, this state machine contains four transition conditions: play_button_pushed=TRUE, CD_in_player=TRUE, stop_button_pushed=TRUE, and CD_spinning=FALSE. Each of these transition conditions would be assigned to a bit in an input word as shown in the 32-bit input word of FIG. 9. Since there are only four transition conditions, only bits 0–3 are used while bits 4–31 are unused.

A problem is that software has to be written that reads the inputs, debounces the inputs, and either sets or clears the appropriate bit in the input word. This software is written as a single function called the state machine input word processing function. It is executed by the FSM engine every time the state machine is processed. In the example above, the input word processing function would set bit 0 when the play button was pushed, clear bit 0 when the play button was not pushed, set bit 1 when a CD was in the CD player, clear bit 1 when a CD was not in the CD player, etc. Note that an input word value 0xFFFFFFFF is reserved by the FSM engine. ("0x" indicates that the following bits are characterized in hexadecimal. Hexadecimal uses the characters from 0 to F to indicate decimal 0 to 15, which rendered into binary digits, run from 0000 to 1111. Eight "F's" thus indicates eight groups of 1's, which is 32 1's.) This means that state machines must be designed so that no situations exist where all bits are set, i.e., 1's, simultaneously.

State machine transitions are completely controlled by the transition conditions in the input word. The FSM engine of the present invention determines whether it is time to transition or not based on the transition conditions for the current state, not the next state. What this means is that a statement like "next_state=play_CD" never shows up in any state machine implementation.

Each transition has a "condition" mask and a "don't care" mask associated with it. This association is made in the state machine configuration which is discussed later. The don't care mask tells the FSM engine which bits to look at in the input word. A bit value of 1 in the don't care mask indicates the bit is relevant to the transition, while a bit value of 0 tells the FSM engine to ignore the bit. The condition mask defines which bit values should be present in order to take a transition. Using the above example, the transition from Standby to Play CD uses a don't care mask of 0x00000003 and a condition mask of 0x00000003. Since the "3" in the don't care mask represents 0011 in hexadecimal, the FSM engine only looks at bits 0 and 1. The "3" in the condition mask means that there has to be a 1 in bits 0 (play_button_pushed) and 1 (CD_in_player) in order to take a transition. Likewise, the transition from Play CD to Standby would use a don't care mask of 0x0000000C (decimal "12", corresponding to binary 1100, which indicates bits 2 and 3 in the 32-bit word, i.e., CD_spinning and stop_button_pushed) and a condition mask of 0x00000008 (decimal "8", corresponding to binary 1000, meaning there has to be a 1 in bit 3 of the 32-bit word).

Signal functions provide a way for state machines to communicate. For example, an elevator car state machine sends a signal to an elevator control system state machine to let it know whether it is moving or not. The elevator control system state machine would contain elevator_moving(void) and elevator_stopped( ) signal functions. These functions would be called by the elevator car state machine to let the elevator control system state machine know what the elevator car was doing. Just before the elevator started to move to a floor it would call the elevator_moving(void) signal function and just after the elevator arrived at a floor it would call the elevator_stopped(void) signal function.

Signal functions come in pairs to give a binary functionality. In addition, a pair of signal functions is assigned to a bit in a state machine's input word so the signal functions can affect another state machine's state. For the above elevator example, the corresponding transition condition would be elevator_moving=TRUE/FALSE. A bit in the elevator control system state machine input word is assigned to this elevator_moving condition. The elevator_moving (void) function sets the assigned bit and the elevator_stopped(void) function clears the assigned bit.

In the preferred embodiment, two state machine timers, timer 1 and timer 2, are supported by the FSM engine to support state transitions triggered by timeouts. These timers are enabled by enable functions provided by the FSM engine. They can also be disabled through disable functions provided by the FSM engine. An additional function is provided for each timer to reset the timer timeout without disabling the timer. For example, if a timer was enabled for 30 seconds and at t=15 seconds a new timeout of 60 seconds was set, then the timer would timeout after 60–15=45 more seconds. Other preferred additional functions include pausing the timers without disabling them, restarting the timers after having been paused, and the ability to get the timer value for each timer.

Figure 9:
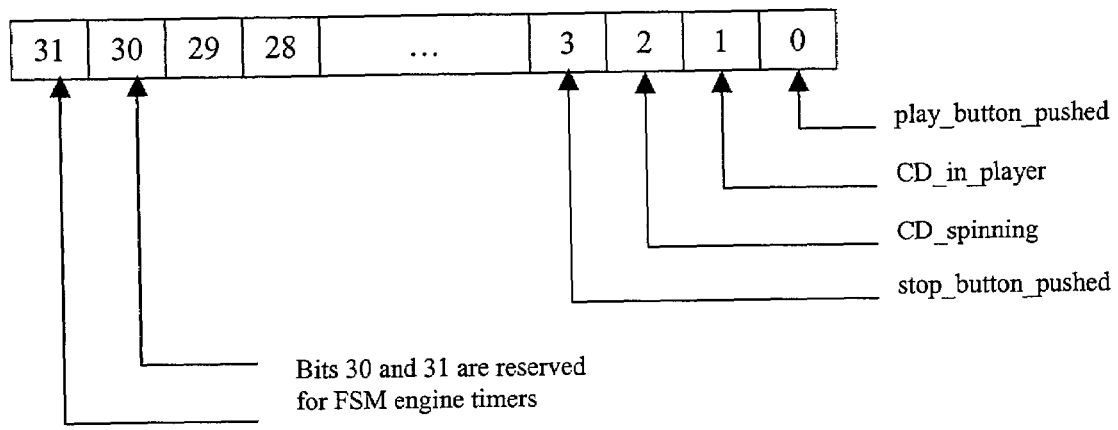
FIG. 9 shows an input word with the four transition conditions of FIG. 8 assigned to bits.

Each timer is assigned a bit in the input word. Timer 1 is assigned to bit 31 and timer 2 is assigned to bit 30 (FIG. 9). These assignments are determined by the FSM engine and can not be changed. In addition, the setting and clearing of these bits is performed by the FSM engine and not by a state machine's input processing function or signal functions. In effect, a state machine designer has 30 bits (bits 0–29) in the input word to use and bits 30 and 31 are reserved by the FSM engine.

Figure 10:
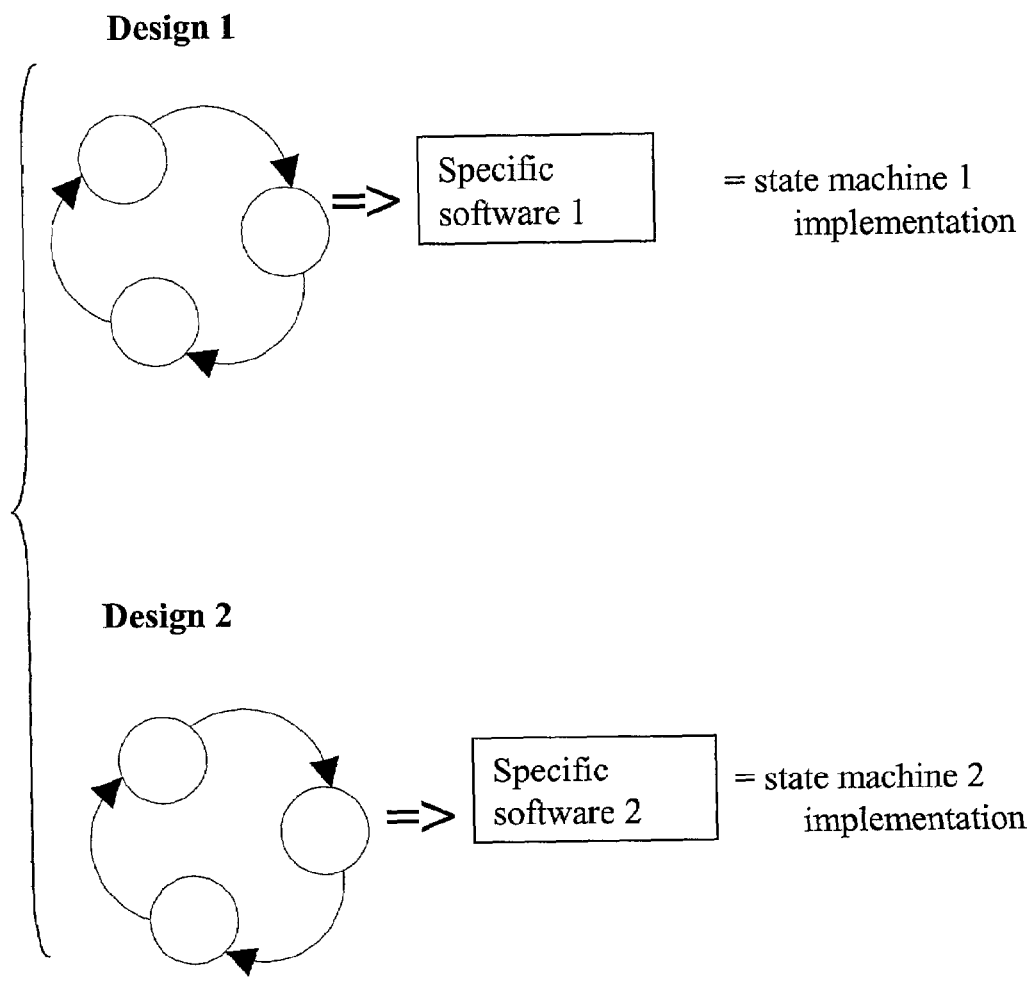
FIG. 10 shows an example of the prior art method of implementing state machines.

The FSM engine is configuration driven while the same set of source code is executed for each individual state machine. Referring to FIG. 10, showing the prior art method of state machines, specific software is written for each state machine based on the state machine design. For example, if current state=state A, then perform state A activities; check "transition to state B" conditions; if time to transition, then set current state=state B (i.e., transition to state B), etc. Changes in the state machine design drive changes in executable software (e.g., the "Specific software 1" in FIG. 10) if one adds or removes a state, changes transition conditions, etc. One changes the specific software, shown here as going from Specific software 1 to Specific software 2, in order to achieve a new state machine implementation.

Figure 11:
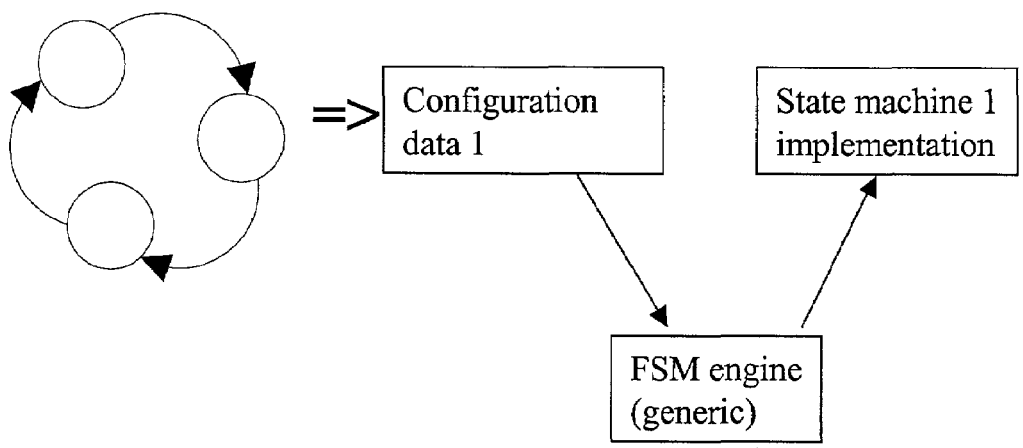
FIG. 11 shows an example of the method of the invention for implementing state machines.
Figure 11:
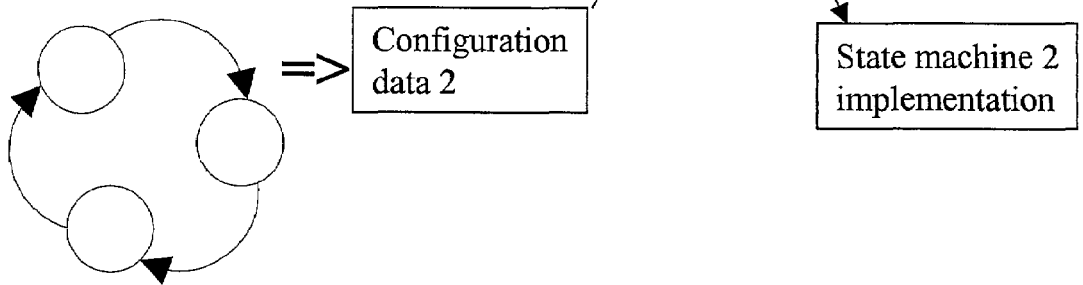

According to the present invention, however, with the FSM engine, specific configurations are generated for each state machine as shown by Configuration data 1 and Configuration data 2 in FIG. 11 using a common method. A common configuration structure is used by all state machine implementations. A common, straightforward approach is used for creating a configuration from a design (i.e., a state diagram). Changes in the state machine design drive changes in the configuration data instead of in executable software. Note how changing only the configuration data in FIG. 11 from configuration data 1 to configuration data 2 changes the state machine implementation from state machine 1 implementation to state machine 2 implementation. The same FSM engine executable software is used for all state machine implementations.

Figure 12:
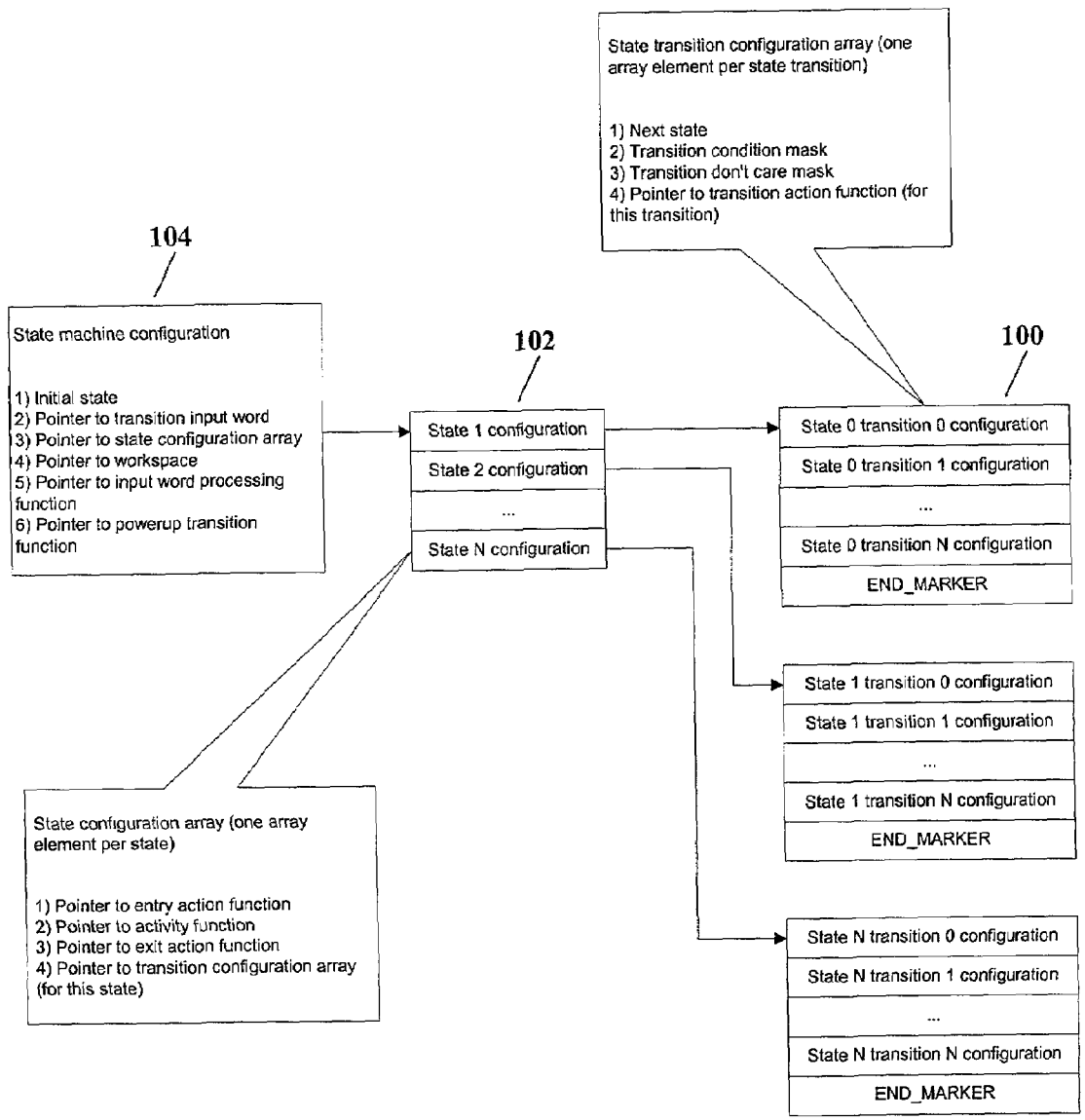
FIG. 12 shows a state machine configuration according to the present invention.

Referring to FIG. 12, a state machine configuration consists of three parts according to the present invention:

(1) state transition configuration arrays with one element for each transition and one array for each state as shown at 100, (2) state configuration array with one element for each state as shown at 102, and (3) the main state machine configuration as shown at 104.

State transition configuration array. Each state has an associated state transition configuration array where each element in the array corresponds to a transition out of the state. The order of the transitions in the array is arbitrary. However, the FSM engine assumes that each transition is mutually exclusive, i.e., only one transition's condition expression can be true at any given time. Note that transitions don't need to be mutually exclusive if they go to the same state and perform the same transition action. State transition configurations contain the following information: next state, condition mask, don't care mask, and pointer to the transition action function (use NULL if no transition action is defined for this transition).

State configuration array. Each element in the state configuration array corresponds to a state. The index of the states in the state configuration array defines the state number. This index must be the same as the #defined list of states defined for the state machine (explained later). State configurations contain the following information: pointer to the entry action function (use NULL if no entry action is defined for this state), pointer to the activity function (use NULL if no activity function is defined for this state), pointer to the exit action function (use NULL if no exit action is defined for this state), and pointer to the transition configuration array for this state.

Main state machine configuration. Main state machine configurations contain the following information: initial state, pointer to the transition input word, pointer to the state configuration array, pointer to the state machine workspace, pointer to the input word processing function, and pointer to the powerup transition action function.

Figure 13:
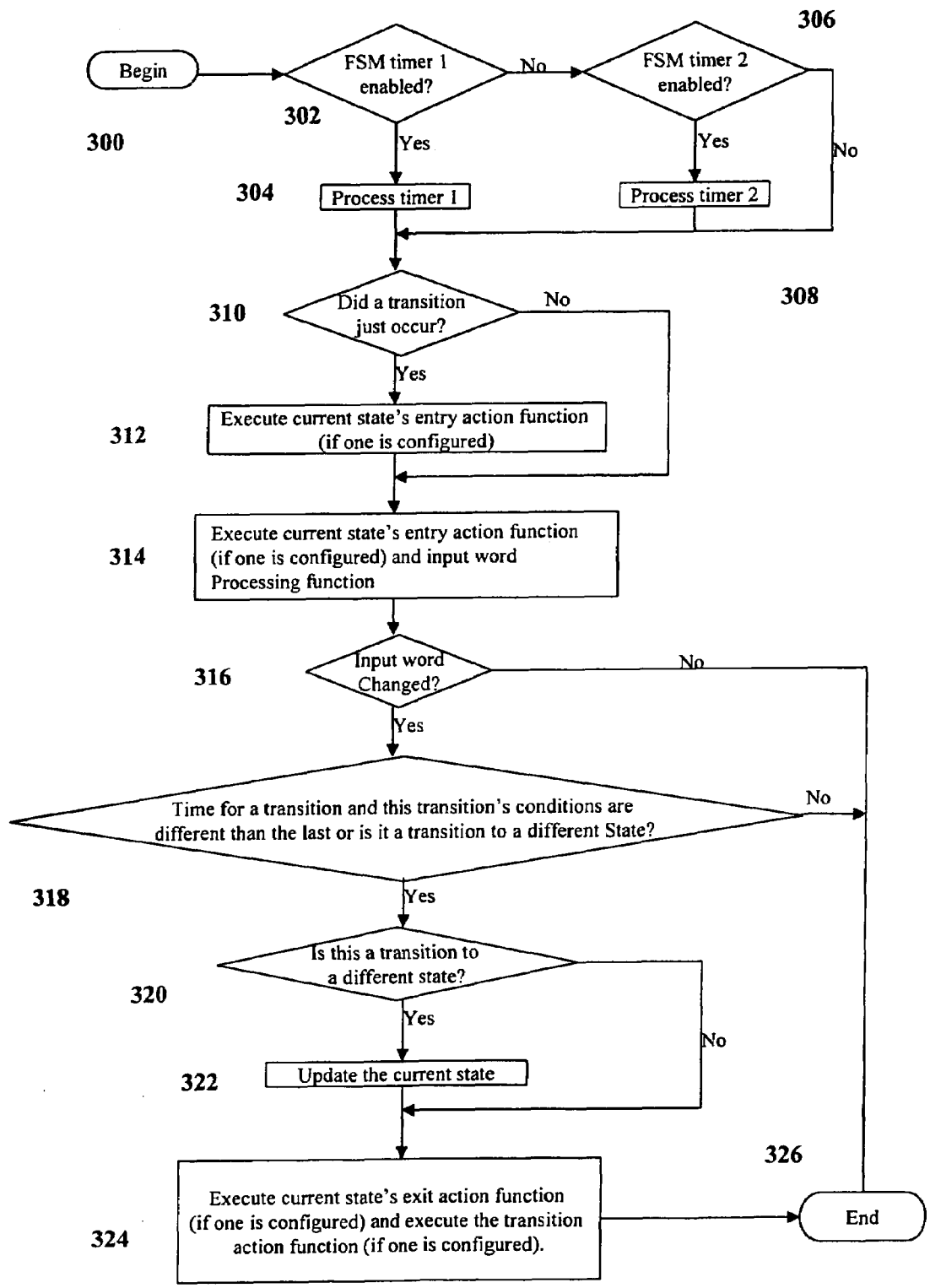
FIG. 13 shows a flow chart depicting the function void fsm_process(const FSM_CONFIG_T *fsm_config_ptr) according to the present invention.

Functions. The public interface to the FSM engine includes some functions which are described herein using C programming language or a variant thereof. It is considered within the ability of one skilled in the art to implement the present invention in another programming language.

void fsm_init(const FSM_CONFIG_T *fsm_config_ptr) initializes a state machine defined by the passed state machine configuration. It should be called upon powerup.

void fsm_process(const FSM_CONFIG_T *fsm_config_ptr) processes a state machine defined by the passed state machine configuration. It should be called periodically. A flow chart of this process is shown in FIG. 13.

void fsm_timer1_enable(<unsigned 32 type>timeout, const FSM_CONFIG_T *fsm_config_ptr) enables timer 1 of the state machine defined by the passed state machine configuration. The timeout is in ticks where ticks corresponds to the rate that the state machine is processed (by a fsm_process function call). It should be called as needed by state entry action, exit action, transition actions, and activity functions.

void fsm_timer1_new_timeout(<unsigned 32 type>timeout, const FSM_CONFIG_T *fsm_config_ptr) assigns a new timeout for timer 1 of the state machine defined by the passed state machine configuration. The timeout is in ticks where ticks corresponds to the rate that the state machine is processed (by a fsm_process function call). It should be called as needed by state entry action, exit action, transition actions, and activity functions.

void fsm_timer1_disable(const FSM_CONFIG_T *fsm_config_ptr) disables timer 1 of the state machine defined by the passed state machine configuration. It should be called as needed by state entry action, exit action, transition actions, and activity functions.

void fsm_timer1_stop(const FSM_CONFIG_T *fsm_config_ptr) pauses timer 1 without disabling it. It should be called as needed by state entry action, exit action, transition actions, and activity functions.

void fsm_timer1_start(const FSM_CONFIG_T *fsm_config_ptr) restarts timer 1 after it was stopped with fsm_timer1_stop. It should be called as needed by state entry action, exit action, transition actions, and activity functions.

<unsigned 32 type>fsm_timer1_get_elapsed(const FSM_CONFIG_T *fsm_config_ptr) returns timer 1's timer value. It should be called as needed by state entry action, exit action, transition actions, and activity functions.

void fsm_timer2_enable(<unsigned 32 type>timeout, const FSM_CONFIG_T *fsm_config_ptr) enables timer 2 of the state machine defined by the passed state machine configuration. The timeout is in ticks where ticks corresponds to the rate that the state machine is processed (by a fsm_process function call). It should be called as needed by state entry action, exit action, transition actions, and activity functions.

void fsm_timer2_new_timeout(<unsigned 32 type>timeout, const FSM_CONFIG_T *fsm_config_ptr) assigns a new timeout for timer 1 of the state machine defined by the passed state machine configuration. The timeout is in ticks where ticks corresponds to the rate that the state machine is processed (by a fsm_process function call). It should be called as needed by state entry action, exit action, transition actions, and activity functions.

void fsm_timer2_disable(const FSM_CONFIG_T *fsm_config_ptr) disables timer 2 of the state machine defined by the passed state machine configuration. It should be called as needed by state entry action, exit action, transition actions, and activity functions.

void fsm_timer2_stop(const FSM_CONFIG_T *fsm_config_ptr) pauses timer 2 without disabling it. It should be called as needed by state entry action, exit action, transition actions, and activity functions.

void fsm_timer2_start(const FSM_CONFIG_T *fsm config_ptr) restarts timer 2 after it was stopped with fsm_timer1_stop. It should be called as needed by state entry action, exit action, transition actions, and activity functions.

<unsigned 32 type>fsm_timer2_get_elapsed(const FSM_CONFIG_T *fsm_config_ptr) returns timer 2's timer value. It should be called as needed by state entry action, exit action, transition actions, and activity functions.

<unsigned 8 type>fsm_get_current_state(const FSM_CONFIG_T *fsm_onfig_ptr) returns the current state of the state machine defined by the passed state machine configuration. The value returned is equal to the #defined index value described later. Typically, this would be called outside of the state machine by another state machine's input word processing function or for software development purposes.

void fsm_clear_trans_history(const FSM_CONFIG_T *fsm_config_ptr) overrides the transition race condition protection. It should be called as needed by state entry action, exit action, transition actions, and activity functions.

Structure Data types The public interface to the FSM engine includes some structure data types which are described herein using C programming language or a variant thereof. The "/* . . . */" construction denotes a non-executable comment.

FSM_TRANS_CONFIG_T is the state transition configuration data type. It consists of the following members:

```
<unsigned 8 type> next_state;
<unsigned 32 type> trans_cond_mask; /* Transition condition mask (use 0 for don't care bits) */
<unsigned 32 type> trans_dont_care_mask; /* Transition don't care mask to indicate don't care conditions with a 0 */
void (*trans_funct_ptr)(void); /* Function to run upon state transition to next state */
```

FSM_STATE_CONFIG_T is the state configuration data type. It consists of the following members:

```
void (*entry_action_funct_ptr)(void); /* Function to run upon state entry */
void (*activity_funct_ptr)(void); /* Function to run while in the state */
void (*exit_action_funct_ptr)(void); /* Function to run upon state entry */
FSM_TRANS_CONFIG_T *state_trans_config_ptr; /* Pointer to current state transition config */
```

FSM_CONFIG_T is the main state machine data type. It consists of the following members:

```
<unsigned 8 type> initial_state;
<unsigned 32 type> *trans_input_ptr;
FSM_STATE_CONFIG_T *state_config_ptr;
FSM_WORKSPACE_T *workspace_ptr;
void (*process_inputs_funct_ptr)(void); /* Function to process the input word bits */
void (*powerup_trans_funct_ptr)(void); /*power transition action function*/
FSM_WORKSPACE_T is the state machine workspace data type. The workspace is used internally by the FSM engine. It consists of the following members:
    <unsigned 32 type> timer1;
    <unsigned 32 type> timer1_timeout;
    <unsigned 32 type> timer2;
    <unsigned 32 type> timer2_timeout;
    <unsigned 32 type> last_input_word; /* Last input word */
    <unsigned 32 type> last_event_trans_cond_mask; /* Last condition mask that caused an event */
    <unsigned 8 type> timer1_enable; /* Indicates whether timer1 is enabled or not */
    <unsigned 8 type> timer2_enable; /* Indicates whether timer2 is enabled or not */
    <unsigned 8 type> current_state;
    <unsigned 8 type> transition; /* Flag to indicate that a transition just occurred */
```

Any state machine implemented using the present invention is instantiated (in object technology, "instantiate" means to create an object of a specific class) by defining a state machine configuration and calling the FSM engine initialization (fsm_init) and process (fsm_process) functions appropriately. The state machine's public interface includes the following:
  #defined list of states
  state machine configuration
  signal functions An example of a #defined list of states for a CD play state machine would be as follows:
define STANDBY 0
define PLAY_CD 1
define EJECT_CD 2
etc.

The value defined in the list above is the value returned by the fsm_get_current_state function described above. Note that the value assigned to the state must be the same as the index of the state in the state configuration array.

A state machine is implemented preferably using five files as follows:

<state machine name>_fsm_config.c
<state machine name>_fsm_functs.c
<state machine name>_fsm_input.c
<state machine name>_fsm_private.h
<state machine name>_fsm_public.h Each of these files is described as follows.

<state machine name>_fsm_config.c preferably contains the allocation of the state machine workspace. It also contains the allocation of the state machine configuration which includes the main state machine configuration, state configuration array, and state transition configuration arrays.

<state machine name>_fsm_functs.c preferably contains the implementations of the state activity functions, entry action functions, exit action functions, and the state transition action functions. It also contains any variables internal to the state machine required by the state machine logic.

<state machine name>_fsm_input.c preferably contains the allocation of the state machine input word variable. It also contains the implementations of the state machine input word processing function and the state machine signal functions.

<state machine name>_fsm_private.h preferably contains any #defined symbols internal to the state machine required by the state machine logic. It also contains an extern of the state machine input word variable. In addition, it contains prototypes for the input word processing function, state activity functions, entry action functions, exit action functions, state transition action functions, and any other functions or variables internal to the state machine required by the state machine logic.

<state machine name>_fsm_public.h preferably contains the #defined list of states, the extern of the state machine configuration, and the prototypes of the state machine signal functions.

Referring now to FIG. 13, a flow chart depicts the function void fsm_process(const FSM_CONFIG_T *fsm_config_ptr) which processes a state machine defined by the passed state machine configuration. The function begins in step 300. In step 302, the system determines if FSM timer1 is enabled, and if not, checks to see if FSM timer2 is enabled in step 306. If FSM timer1 is enabled, timer1 is processed in step 304, while if timer2 is enabled, timer2 is processed in step 308. The system then checks in step 310 to see if a transition just occurred. If so, the current state's entry action function is executed in step 312 if one is configured. If no transition occurred, control passes to step 314. In step 314, the current state's activity function, if one is configured, and the input word processing function are executed. Then in step 316, the system determines if the input word has changed. If not, control passes to the end of the method in step 326. If yes, the system determines in step 318 if it is time for a transition, whether this transition's conditions are different than the last one, or whether this is a transition to a different state. If none of these apply, then control passes to step 326. If any of these apply, the system then determines whether this is a transition to a different state in step 320, and if so, the current state is updated in step 322. If not, step 322 is bypassed. Then in step 324, the current state's exit action function, if one is configured, is executed, along with the transition action function, also if one is configured. The function then ends in step 326.

An alternate explanation of the invention is that the invention is a reentrant and re-usable software component consisting of a configurable (i.e., generic) state machine algorithm (method). This algorithm is designed to process state machines periodically in a periodic task or loop. Being configurable and reentrant means that the state machine algorithm can be used for multiple state machine implementations.

State transition conditions are communicated to a state machine using what is called a transition input word. A unique transition input word is allocated for each state machine. A transition input word is a 32 bit variable where each bit represents a single transition condition. The location for each transition condition bit is determined by an arbitrary bit position selection. This arbitrary selection is made by the specific state machine designer. Note: Bits 30 and 31 are reserved for state machine timer 1 and state machine timer 2 which are maintained by the configurable state machine algorithm (FIG. 9).

The bit values in the transition input word are updated by a function called the state machine input word processing function. A unique input word processing function is written for each state machine by the specific state machine designer. This function is executed by the configurable state machine algorithm every time the state machine is processed The state machine algorithm is reentrant through the use of a defined workspace data structure stored in RAM. A unique workspace data structure is allocated for each state machine and is used to store all persistent data for each state machine. This data in each state machine's workspace data structure is maintained by the configurable state machine algorithm. The workspace data structure contains the information shown in Table 1.

TABLE 1 state machine timer 1
state machine timer 1 timeout value
state machine timer 2
state machine timer 2 timeout value
last input word value that caused a transition
last event transition condition mask that caused a transition
state machine timer 1 enable flag
state machine timer 2 enable flag
current state
transition just occurred flag The state machine algorithm is configurable through the use of a defined configuration structure. A unique configuration structure is allocated and populated with specific data for each state machine. Specific state machine behavior is contained in each state machine's configuration data. The configuration data structure contains the information shown in Table 2.

TABLE 2 initial state
pointer to transition input word
pointer to state configuration array
pointer to workspace
pointer to input word processing function
pointer to powerup transition action function The "pointer to state configuration array" referenced in the configuration structure points to an array of state configurations. Each element in the array corresponds to a particular state in the state machine and contains configuration data for that state. The state machine designer creates a #defined list of states where the values correspond to the index in the state configuration array. The state configuration data structure contains the information shown in Table 3.

TABLE 3 pointer to state entry action function
pointer to state activity function
pointer to state exit action function
pointer to state transition configuration array The "pointer to state transition configuration array" referenced in the state configuration structure points to an array of state transition configurations. Each element in the array corresponds to a particular transition for each state. It contains configuration data for that transition. The state transition configuration data structure contains the information shown in Table 4.

TABLE 4 next state (index in the state configuration array)
transition condition mask

Figure 14:
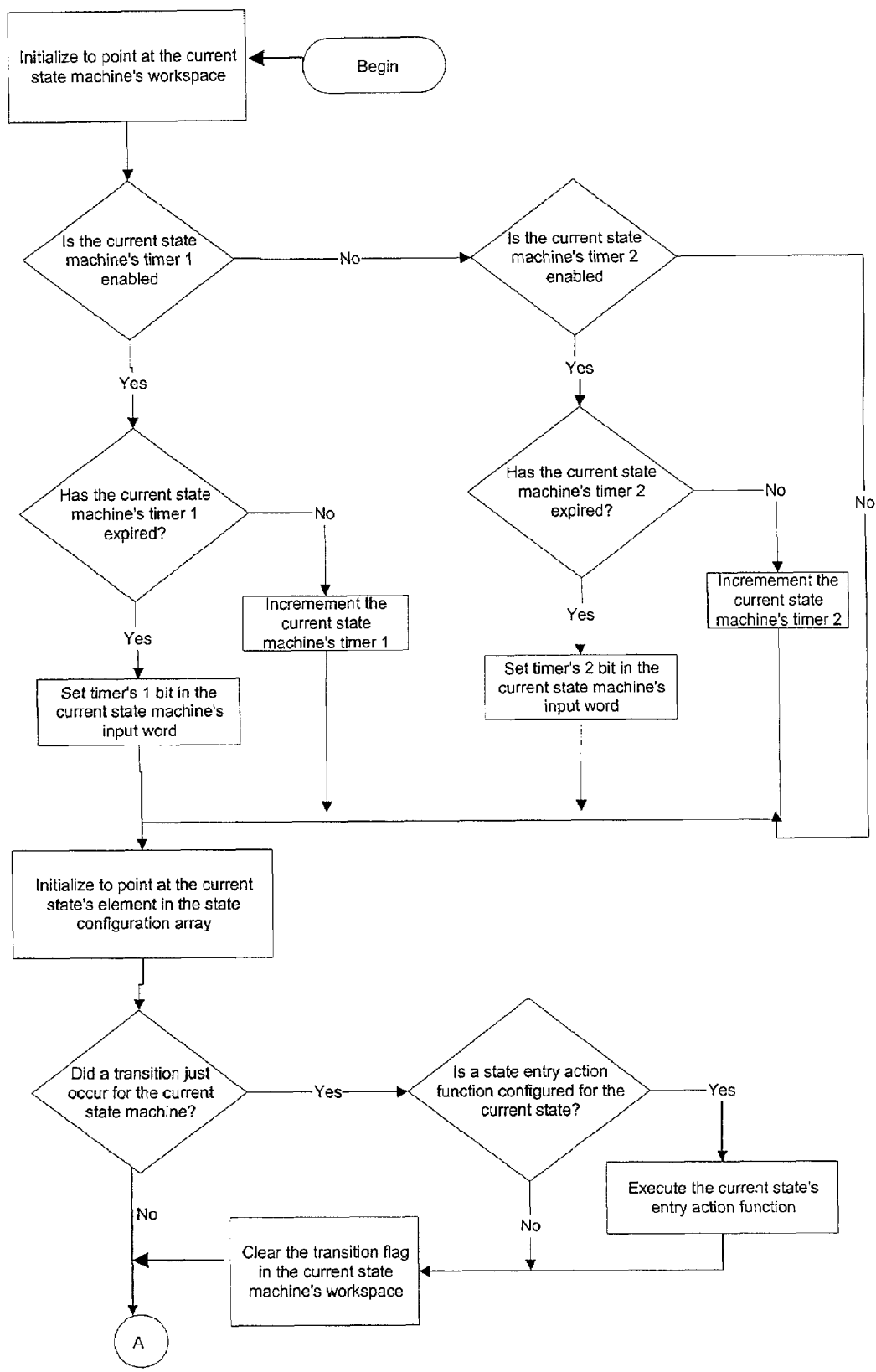
FIG. 14 shows a portion of the flow chart of the FSM engine of the present invention.
Figure 15:
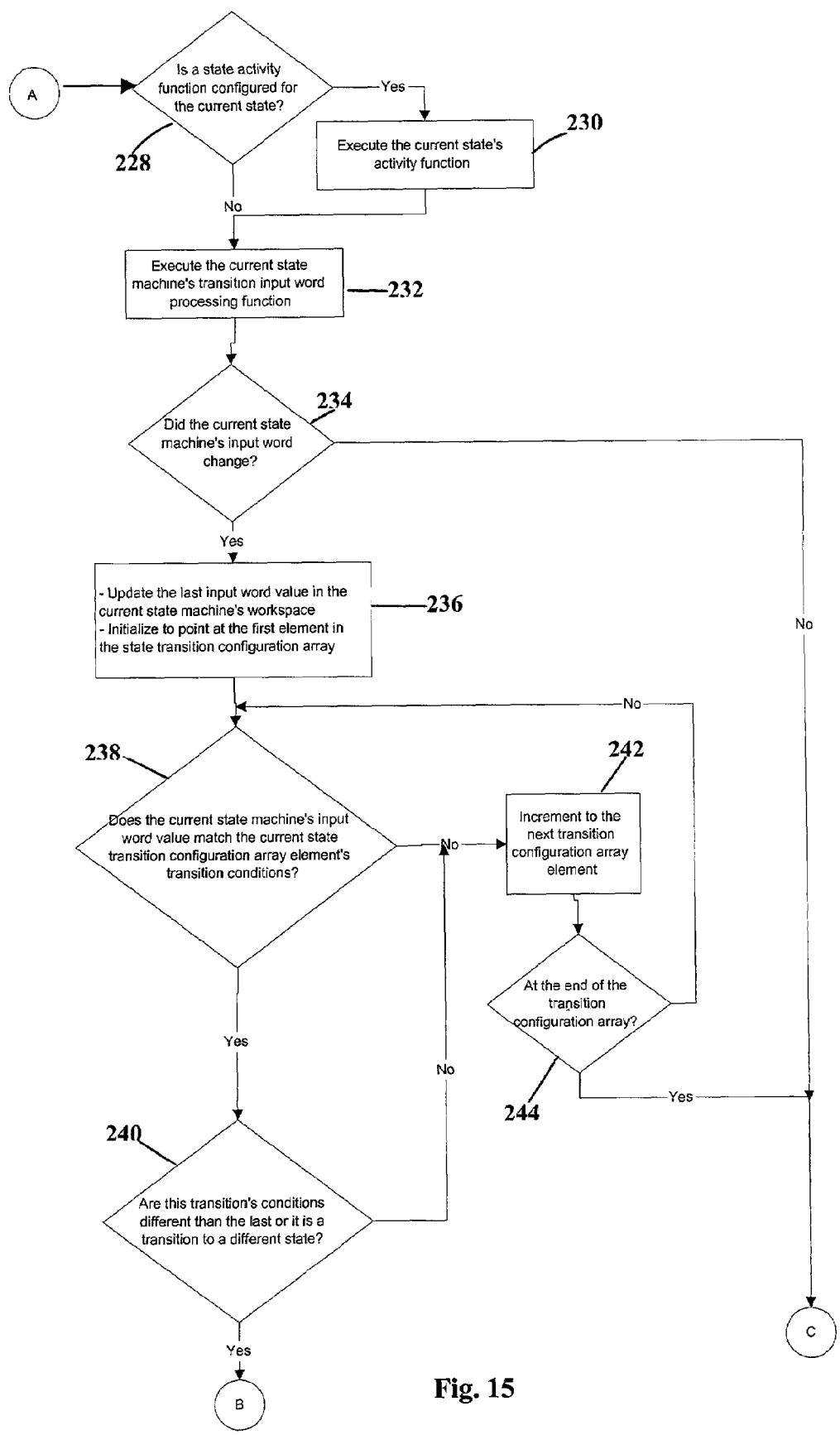
FIG. 15 shows a portion of the flow chart of the FSM engine of the present invention.
Figure 16:
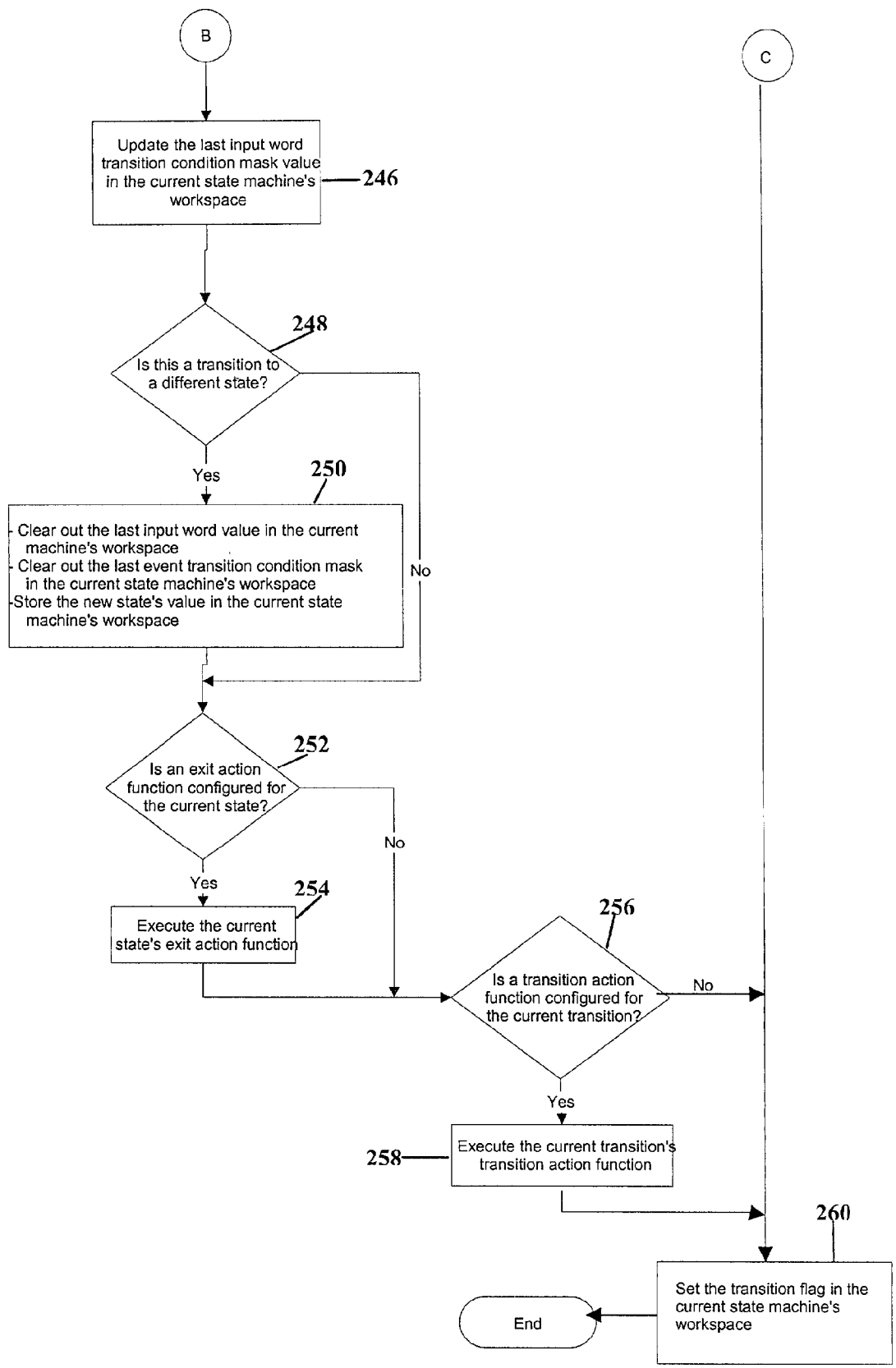
FIG. 16 shows a portion of the flow chart of the FSM engine of the present invention.

TABLE 4-continued transition don't care mask
pointer to transition action function Referring to FIGS. 14–16, a flow chart of the FSM engine, i.e., the configurable state machine process, according to an embodiment of the invention is shown. In the flow chart, the "current state machine" corresponds to the specific state machine configuration which is passed to the configurable state machine algorithm and system.

The method begins. In step 200, the system is initialized to point at the current state machine's workspace. In step 202, the system determines if the current state machine's timer 1 is enabled. If so, the system determines if the current state machine's timer 1 has expired in step 204. If so, the bit for timer 1 is set in the current state machine's input word in step 206 before control is passed to step 210. If the current state machine's timer 1 has not expired, the current state machine's timer 1 is incremented in step 208, after which control is passed to step 210. If the current state machine's timer 1 is not enabled in step 202, the system determines if the current state machine's timer 2 is enabled in step 220. If not, control passes to step 210. If yes, the system determines if the current state machine's timer 2 has expired in step 222. If so, the bit for timer 2 is set in the current state machine's input word in step 224 before control is passed to step 210. If not, the current state machine's timer 2 is incremented in step 226 before control is passed to step 210.

In step 210, the system is initialized to point at the current state's element in the state configuration array. In step 212, the system determines if a transition just occurred for the current state machine. If so, the system determines in step 214 if a state entry action function is configured for the current state. If so, the current state's entry action function is executed in step 216. If not, the system clears the transition flag in the current state machine's workspace in step 218, after which control passes to step 228 in FIG. 15. If, in step 214, no state entry action function is configured for the current state, the system goes directly to step 218. If in step 212 a transition did not just occur for the current state machine, control passes to step 228 in FIG. 15.

In step 228, the system determines if a state activity function is configured for the current state. If so, the current state's activity function is executed in step 230 before control passes to step 232. If not, the current state machine's transition input word processing function is executed in step 232. In step 234, the system determines if the current state machine's input word changed. If so, in step 236 the last input word value in the current state machine's workspace is updated and the system is initialized to point at the first element in the state transition configuration array. If the current state machine's input word has not changed, control passes to step 260.

After step 236, the system determines in step 238 if the current state machine's input word value matches the current state transition configuration array element's transition conditions. If not, the system increments in step 242 to the next transition configuration array element. Then in step 244 the system determines if it is at the end of the transition configuration array. If so, control passes to step 260. If not, control passes back to step 238. Once the current state machine's input word value matches the current state transition configuration array element's transition conditions in step 238, the system determines in step 240 if the current transition's conditions are different than the last or if instead this is a transition to a different state. If no difference, control passes to step 242. If there is a difference, the last input word transition condition mask value in the current state machine's workspace is updated in step 246, after which the system determines in step 248 if this is now a transition to a different state. If so, in step 250 the last input word value in the current state machine's workspace is cleared out, as is the last event transition condition mask value in the current state machine's workspace. The new state's value is stored in the current state machine's workspace. If this is not now a transition to a different state in step 248, control passes to step 252.

In step 252, the system determines if an exit action function configured for the current state. If so, the current state's exit action function is executed in step 254, after which control passes to step 256. If not, control passes to step 256. Then the system determines in step 256 if a transition action function is configured for the current transition, and if not, control passes to step 260. If so, the current transition's transition action function is executed in step 258. Then in step 260, the transition flag is set in the current state machine's workspace. The method ends.

Figure 17:
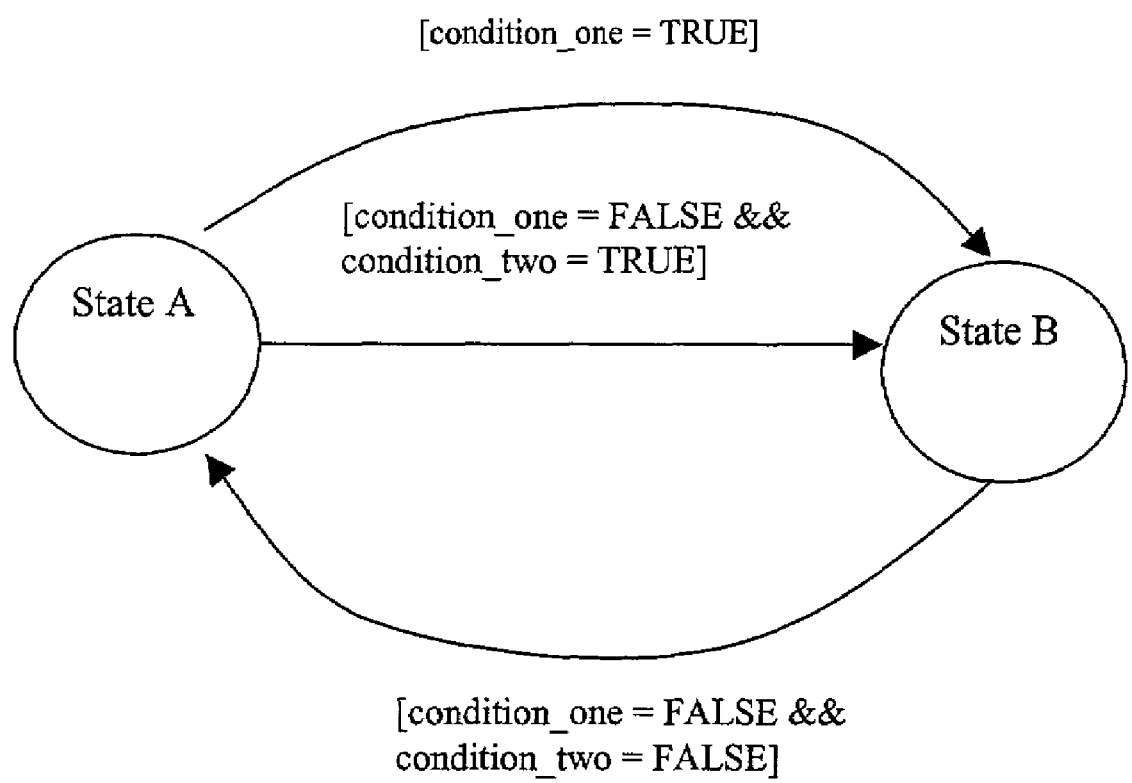
FIG. 17 shows an example of a state machine diagram used in explaining the implementation of the method of the present invention.

An example of the method of the present invention is now described referring to FIG. 17. In the example, there are two transitions from State A to State B. One of the transitions occurs if condition_one is TRUE. The other transition occurs if condition_one is FALSE and condition_two is TRUE. In addition, there is one transition from State B to State A, which occurs if both condition_one and condition_two are FALSE. There are no transition action functions, entry action functions, or exit action functions in this example.

To implement this example using the configurable state machine algorithm (method) of the present invention, perform the following steps. Assume the name of the example state machine is ex_fsm (i.e., example finite state machine).

1. Allocate an unsigned 32-bit RAM variable for the input word.
2. Assign transition condition bits in the input word.
3. Implement the input word processing function.
4. Allocate a state machine workspace structure in RAM.
5. Configure the state machine by
   creating a #define list of states, and
   allocating and populating a state machine configuration structure.
6. At powerup, call the configurable state machine algorithm initialization function passing the address of the state machine configuration.
7. Periodically, call the configurable state machine algorithm processing function passing the address of the state machine configuration.

The actual implementation preferably looks like the following:

1. Allocate the input word as follows: U32_T ex_fsm_workspace;
2. Assign condition_one to bit 0 of the input word and assign condition_two to bit 1 of the input word.
3. Implement the input word processing function as shown by the following pseudo code:

```
void ex_fsm_process_inputs(void)
{
    IF(some external conditions are true for condition one)
```

```
            THEN
                Set bit 0 of the input word
            ELSE
                Clear bit 0 of the input word
            IF(some external conditions are true for condition two)
            THEN
                Set bit 1 of the input word
            ELSE
                Clear bit 1 of the input word
    }
```

4. Allocate a state machine workspace structure in RAM as follows: FSM_WORKSPACE_T ex_fsm_workspace;
5. Configure the state machine as follows:

```
    (a) allocate and populate state transition configuration arrays for each state:
const FSM_TRANS_CONFIG_T ex_fsm_state_a_trans_config[ ] =
{
    { EX_FSM_STATE_B, 0x00000001, 0x00000001, 0 },
    { EX_FSM_STATE_B, 0x00000002, 0x00000003, 0 },
    { FSM_TRANS_END, 0, 0, 0 }
};
const FSM_TRANS_CONFIG_T ex_fsm_state_b_trans_config[] =
{
    { EX_FSM_STATE_A, 0x00000000, 0x00000003, 0 },
    { FSM_TRANS_END, 0, 0, 0 }
};
    (b) allocate and populate the state configuration array:
const FSM_STATE_CONFIG_T ex_fsm_state_config[] =
{
    { /* ex_fsm_state_a state configuration */
        0, /* Use 0 for no state entry action function */
        0, /* Use 0 for no state activity function */
        0, /* Use 0 for no state exit action function */
        &ex_fsm_state_a_trans_config[0]
    },
    { /* ex_fsm_state_b state configuration */
        0, /* Use 0 for no state entry action function */
        0, /* Use 0 for no state activity function */
        0, /* Use 0 for no state exit action function */
        &ex_fsm_state_b_trans_config[0]
    },
};
    (c) allocate and populate the state machine configuration:
const FSM_CONFIG_T ex_fsm_config =
{
    EX_FSM_STATE_A,
    &ex_fsm_trans_input,
    &ex_fsm_state_config[0],
    &ex_fsm_workspace,
    &ex_fsm_process_inputs
};
```

Figure 18:
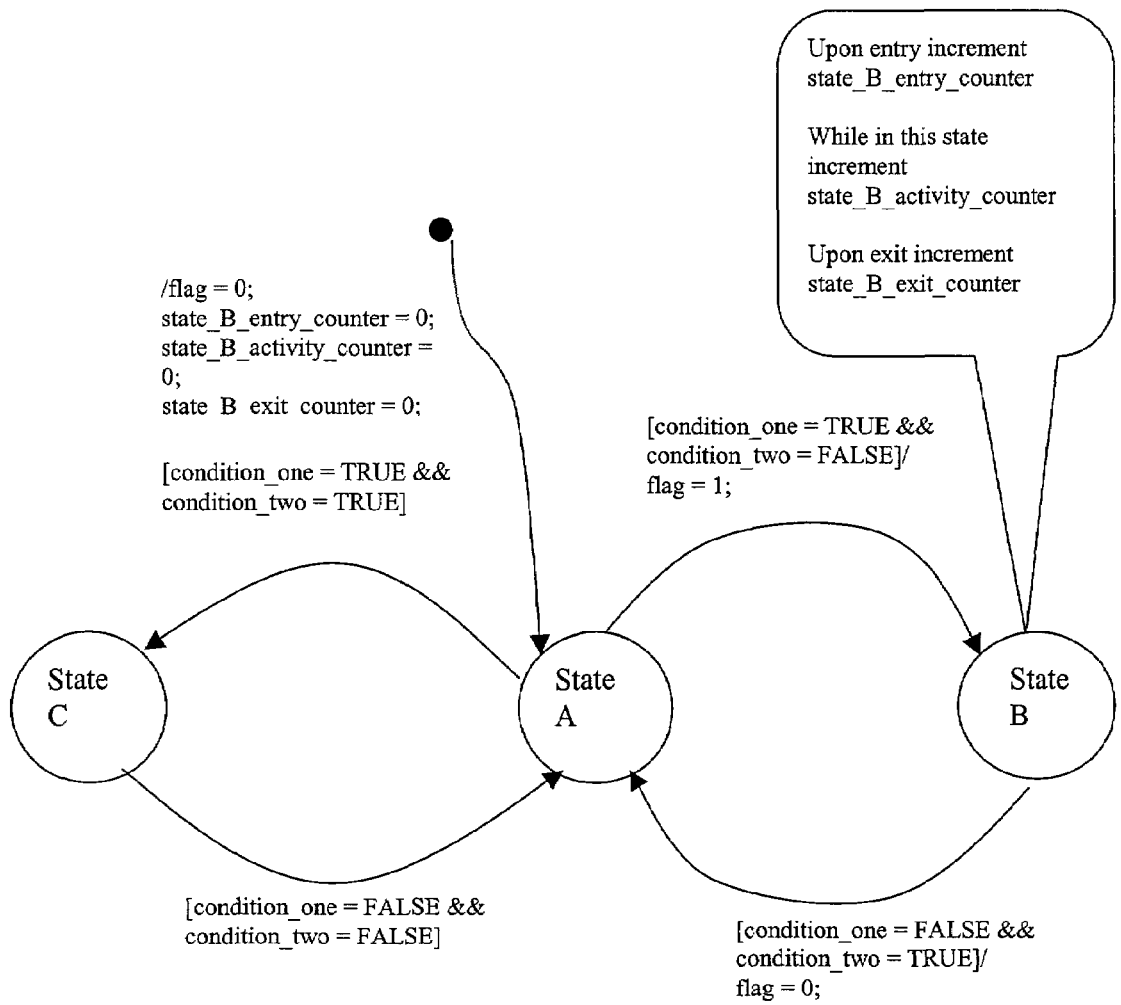
FIG. 18 shows an example of how an FSM configuration is populated from a state machine diagram.

6. At powerup, call the configurable state machine algorithm initialization function passing the address of the state machine configuration as follows: fsm_init(&ex_fsm_config);
7. Periodically, call the configurable state machine algorithm processing function passing the address of the state machine configuration as follows: fsm_process(&ex_fsm_config);

Referring to FIG. 18, an example used to describe how an FSM configuration is populated from a state diagram is shown. In FIG. 18, note that the variables flag state_B_entry_counter, state_B_activity_counter, and state_$_{B13}$ exit_counter are manipulated in this example, but a real state machine would perform more "meaningful" tasks. Also note that states A and C have no activity functions but they most likely would in a real state machine.

The state diagram indicates the following:
(1) There are three states (A, B, and C) with state A being the initial state.
(2) Upon powerup, four variables (flag, state_B_entry_counter, state_B_activity_counter, and state_B_exit_counter) are initialized to 0. This is shown on the diagram by the powerup transition action.
(3) If the current state is state A, condition_one is TRUE, and condition_two is FALSE a transition will occur from state A to state B. When this occurs, the "flag" variable is set to 1.
(4) Upon entry to state B, the "state_B_entry_counter" variable is incremented.
(5) While in state B, the "state_B_activity_counter" variable is incremented.
(6) Upon exit from state B, the "state_B_exit_counter" variable is incremented.
(7) If the current state is state B, condition_one is FALSE, and condition_two is TRUE a transition will occur from state B to state A. When this occurs, the "flag" variable is set to 0.
(8) If the current state is state A, condition_one is TRUE, and condition_two is TRUE a transition will occur from state A to state C but no variables are changed.
(9) If the current state is state C, condition_one is FALSE, and condition_two is FALSE a transition will occur from state C to state A but no variables are changed.

The configuration is generated based on the example as follows:
(1) State constant definitions. Three constants STATE_A, STATE_B, and STATE_C are defined with values of 0, 1, and 2 respectively. The selection of these values is arbitrary but they must be consecutive and start at 0.

Figure 19:
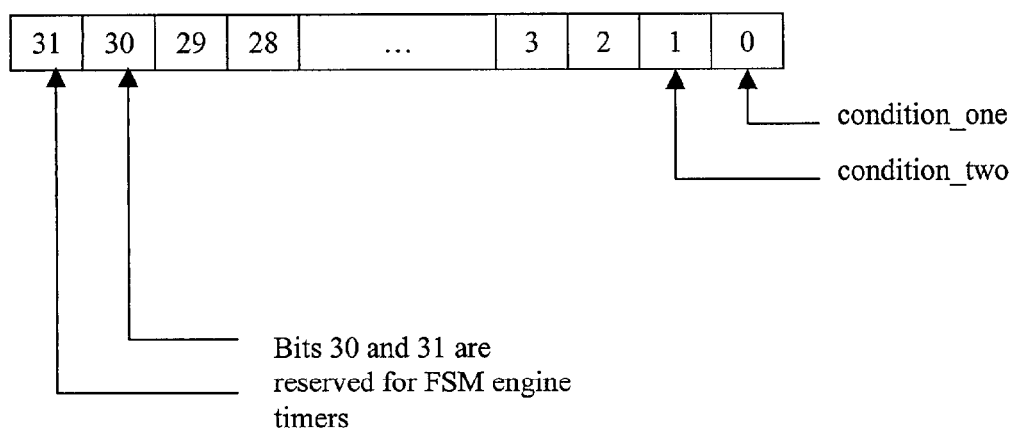
FIG. 19 shows the bit assignments for the transition conditions of the example of FIG. 18.

(2) Input word bit assignments. Since there are only two transition conditions (condition_one and condition_two), only two bits are needed in the input word. The bit selection is arbitrary. The assignments for condition_one and condition_two are chosen as shown in FIG. 19.

(3) Implement various functions. Every state machine requires an input word processing function described in the next section. However, various additional functions are needed based on the diagram.

(a) Input word processing function. This function sets and clears bits in the input word. Assume the name of the transition input word variable is "trans_input_word".

```
Void process_inputs_function(void)
{
    If condition_one is TRUE then set bit 0 in the trans_input_word to 1 else set bit 0 to 0.
    If condition_two is TRUE then set bit 1 in the trans_input_word to 1 else set bit 1 to 0.
}
```

(b) Powerup transition action function. This function implements the tasks defined by the powerup transition action.

```
void powerup_trans_function(void)
{
    flag = 0;
    state_B_entry_counter = 0;
    state_B_activity_counter = 0;
    state_B_exit_counter = 0;
}
```

(c) State A to B transition action function. This function implements the tasks defined by the transition from state A to state B.

```
void A_to_B_trans_function(void)
{
    flag = 1;
}
```

(d) State B to A transition action function. This function implements the tasks defined by the transition from state B to state A.

```
void B_to_A_trans_function(void)
{
    flag = 0;
}
```

(e) State B entry action function. This function implements the tasks defined by the state B entry action function.

```
void state_B_entry_function(void)
{
    state_B_entry_counter++;
}
```

(f) State B activity function. This function implements the tasks defined by the state B activity function.

```
void state_B_activity_function(void)
{
    state_B_activity_counter++;
}
```

(g) State B exit action function. This function implements the tasks defined by the state B exit action function.

```
void state_B_exit_function(void)
{
    state_B_exit_counter++;
}
```

(4) Populate the transition configuration arrays. The definition of the FSM_TRANS_CONFIG_T data type was described earlier.

(a) State A transition configuration. Based on the diagram, there are two transitions out of state A. One goes to state B and one goes to state C. The following procedure is used to configure the transition configuration for state A:

Transition to state B

Use the "STATE_B" constant for the target state.

This transition is dependent on condition_one and condition_two so the bits 0 and 1 of the don't care mask value are set to 1. This yields a value of 0x00000003 for the don't care mask value. The bits in the don't care mask correspond to the bit selection in the input word.

In addition, condition_one has to be TRUE and condition_two has to be FALSE in order to take this transition so bit 0 of the condition mask value is set to 1 and bit 1 is set to 0. This yields a value of 0x00000001 for the condition value. The bits in the condition mask correspond to the bit selection in the input word.

The variable "flag" is set to 1 during this transition and an A_to_B_trans_function function is implemented (above) to do this. The address of this function is used for the transition action function address.

Transition to state C

This transition is dependent on condition_one and condition_two so the bits 0 and 1 of the don't care mask value are set to 1. This yields a value of 0x00000003 for the don't care mask value. The bits in the don't care mask correspond to the bit selection in the input word.

In addition, condition_one has to be TRUE and condition_two has to be TRUE in order to take this transition so bit 0 of the condition mask value is set bits 0 and 1 are set to 1. This yields a value of 0x00000003 for the condition value. The bits in the condition mask correspond to the bit selection in the input word.

Since nothing occurs during this transition, a 0 is used for the transition action function address.

```
FSM_TRANS_CONFIG_T state_A_trans_config[ ] =
{
    { STATE_B, 0x00000001, 0x00000003, &A_to_B_trans_function },
    { STATE_C, 0x00000003, 0x00000003, 0 },
    { FSM_TRANS_END, 0, 0, 0 } /* End marker */
};
```

(b) State B transition configuration. Based on the diagram, there is only one transition out of state B and it goes to state A.

Transition to state A

Use the "STATE_A" constant for the target state.

This transition is dependent on condition_one and condition_two so the bits 0 and 1 of the don't care mask value are set to 1. This yields a value of 0x00000003 for the don't care mask value. The bits in the don't care mask correspond to the bit selection in the input word.

In addition, condition_one has to be FALSE and condition_two has to be TRUE in order to take this transition so bit 0 of the condition mask value is set to 0 and bit 1 is set to 1. This yields a value of 0x00000002 for the condition value. The bits in the condition mask correspond to the bit selection in the input word.

The variable "flag" is set to a 0 during this transition and a B_to_A_trans_function function is implemented (above) to do this. The address of this function is used for the transition action function address.

```
FSM_TRANS_CONFIG_T state_B_trans_config[ ] =
{
    { STATE_A, 0x00000002, 0x00000003, &B_to_A_trans_function },
    { FSM_TRANS_END, 0, 0, 0 } /* End marker */
};
```

(c) State C transition configuration. Based on the diagram, there is only one transition out of state C and it goes to state A.

Transition to state A

Use the "STATE_A" constant for the target state.

This transition is dependent on condition_one and condition_two so the bits 0 and 1 of the don't care mask value are set to 1. This yields a value of 0x00000003 for the don't care mask value.

In addition, condition_one has to be FALSE and condition_two has to be FALSE in order to take this transition so bits 0 and 1 of the condition mask value are set to 0. This yields a value of 0x00000000 for the condition value.

Since nothing occurs during this transition, a 0 is used for the transition action function address.

```
FSM_TRANS_CONFIG_T state_C_trans_config[ ] =
{
    { STATE_A, 0x00000000, 0x00000003, 0 },
    { FSM_TRANS_END, 0, 0, 0 } /* End marker */
};
```

(5) Populate the state configuration array. The definition of the FSM_STATE_CONFIG_T data type was described earlier. The value of the STATE_A constant is 0, STATE_B constant is 1, and the STATE_C constant is 2. This means that index 0 in the state configuration array must be used for state A, index 1 in the state configuration array must be used for state B, and index 2 in the state configuration array must be used for state C.

```
FSM_STATE_CONFIG_T state_config[ ] =
{
    { /* state A config */
    0, /* no entry action so use 0 */
    0, /* no activity so use 0 */
    0, /* no exit action so use 0 */
    &state_A_trans_config[0] /* point at the transition configuration populated above */
    },
    { /* state B config */
    &state_B_entry_function, /* point at the entry action function implemented above */
    &state_B_activity_function, /* point at the activity function implemented above */
    &state_B_exit_function, /* point at the exit action function implemented above */
    &state_B_trans_config[0] /* point at the transition configuration populated above */
    },
    { /* state C config */
    0, /* no entry action so use 0 */
    0, /* no activity so use 0 */
    0, /* no exit action so use 0 */
    &state_C_trans_config[0] /* point at the transition configuration populated above */
    },
};
```

(6) Populate the main configuration. The definition of the FSM_CONFIG_T data type was described earlier. Assume the name of the workspace variable is "workspace".

```
FSM_CONFIG_T main_config =
{
    STATE_A, /* initial state */
    &transition_input_word, /* point at the transition input word */
    &state_config, /* point at the state configuration array populated above */
    &workspace, /* point at the workspace variable */
    &process_inputs_function, /* point at the process inputs function implemented above */
    &powerup_trans_function /* point at the powerup transition function implemented above */
};
```

Figure 20:
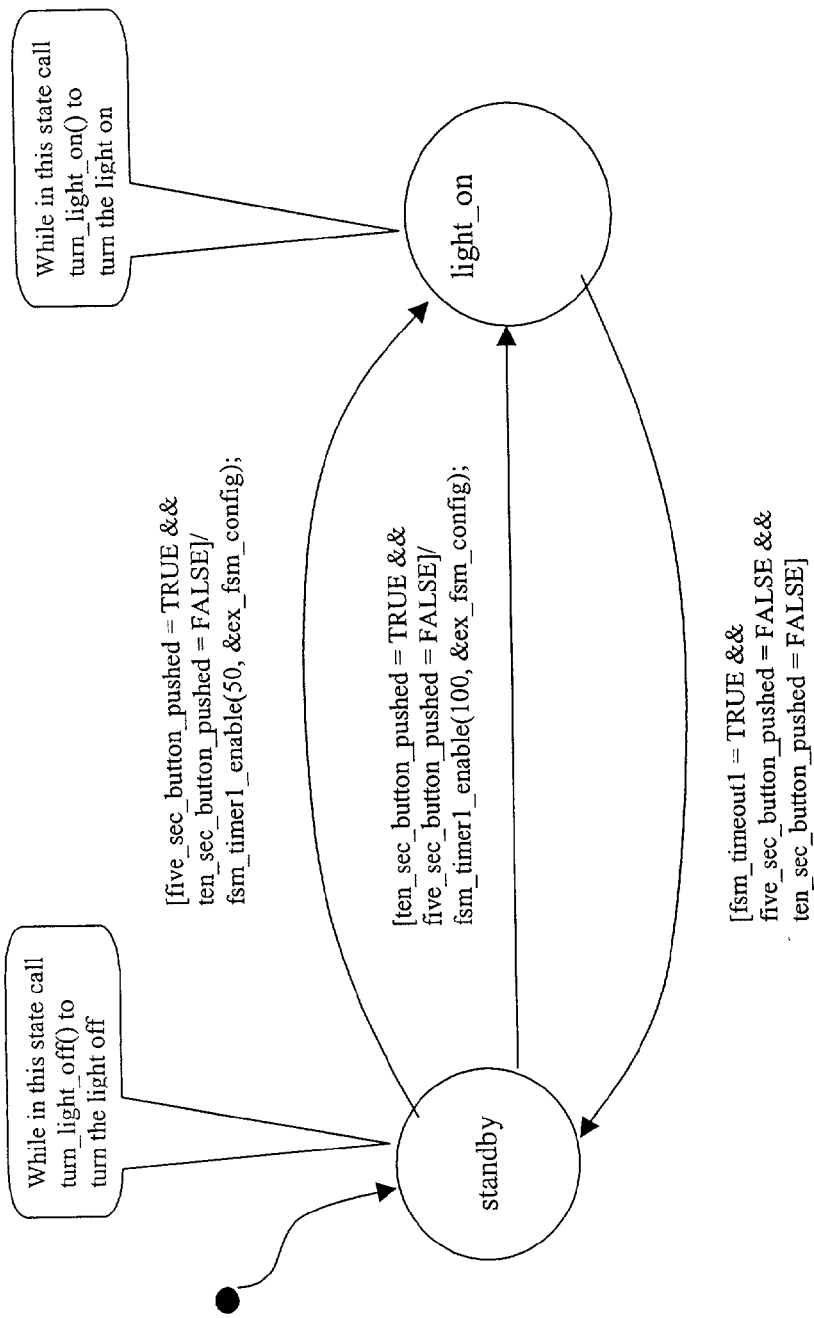
FIG. 20 shows an example of how an FSM configuration is populated from a state machine diagram that uses an FSM timer.

Referring to FIG. 20, an example used to describe how an FSM configuration is populated from a state diagram that uses an FSM timer is shown. Timer functions are described earlier in this document. This example system includes two push buttons and a light. The two push buttons are labeled the five second button and the ten second button. When the five second button is pressed and released the light is turned on for 5 seconds. When the ten second button is pressed and released the light is turned on for 10 seconds.

Assume that the state machine is processed every 100 ms and the name of the state machine configuration is ex_fsm_config. The state diagram indicates the following:

(1) There are two states (standby and light_on) with standby being the initial state.
(2) Upon powerup, nothing requires initialization so there is no powerup transition action.
(3) While in standby, the activity indicates that the turn_light_off function is called to turn the light off. This occurs every 100 ms while in the standby state because the state machine is processed every 100 ms.
(4) If the current state is standby when the five second button is pushed, and the ten second button is not pushed, a transition occurs from standby to light_on. When this occurs, the transition action indicates that FSM timer1 is initialized to 5 seconds. Because this state machine is processed every 100 ms, 10 ticks per second occur, which means that a 5 second timeout requires a value of 5*10=50. Generally, a #defined constant symbol would be used.
(5) If the current state is standby when the ten second button is pushed, and the five second button is not pushed, a transition occurs from standby to light_on. When this occurs, the transition action indicates that FSM timer1 is initialized to 10 seconds. Because this state machine is processed every 100 ms, 10 ticks per second occur, which means that a 10 second timeout requires a value of 10*10=100. Generally, a #defined constant symbol would be used.
(6) While in light_on, the activity indicates that the turn_light_on function is called to turn the light on. This occurs every 100 ms while in the light_on state because the state machine is processed every 100 ms.
(7) If the current state is light_on, FSM timer1 has expired, the five second button is not pushed, and the ten second button is not pushed, a transition occurs from light_on to standby. Nothing happens during this transition so no transition action is required.

The configuration is generated based on the example as follows:

(1) State constant definitions. Two constants STANDBY and LIGHT_ON are defined with values of 0 and 1 respectively. The selection of these values is arbitrary but they must be consecutive and start at 0.

Figure 21:
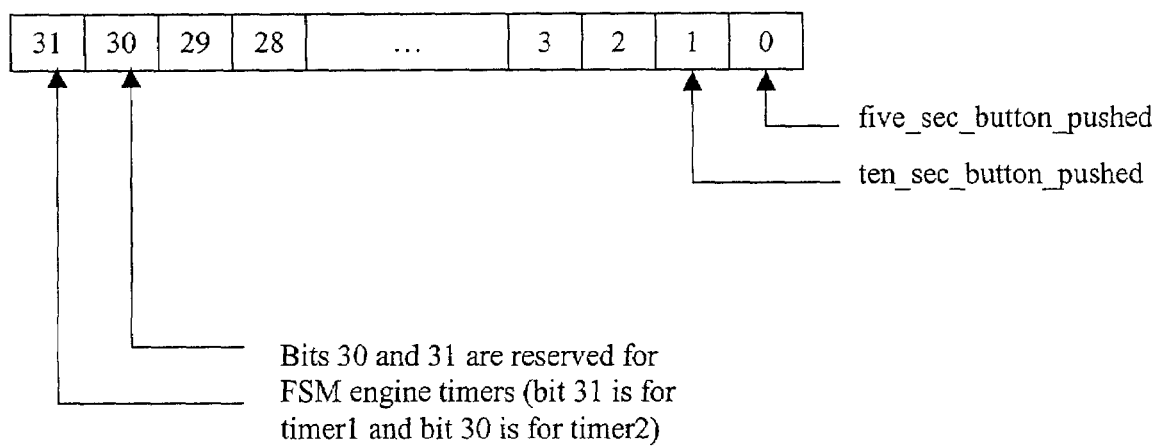
FIG. 21 shows the bit assignments for the transition conditions of the example of FIG. 20.

(2) Input word bit assignments. Since there are only two transition conditions (five_sec_button_pushed and ten_sec_button_pushed), only two bits are needed in the input word. The bit selection is arbitrary. The assignments for five_sec_button_pushed and ten_sec_button_pushed are as shown in FIG. 21.

(3) Implement various functions. Every state machine requires a process inputs function described in (3)(a) below. However, various additional functions are needed based on the diagram which are also explained.

(a) Process inputs function. This function sets and clears bits in the input word. Assume the name of the transition input word variable is "transition_input_word".

```
void process_inputs_function(void)
{
    If the five second button is pushed then set bit 0 in the trans_input_word to 1 else
set bit 0 to 0.
    If the ten second button is pushed then set bit 1 in the trans_input_word to 1 else set
bit 1 to 0.
}
```

(b) "5 second" standby to light_on transition action function. This function implements the tasks defined by the transition from the standby state to the light_on state when the 5 second button is pushed.

```
void standby_to_light_on_5sec_trans_function(void)
{
    fsm_timer1_enable(50, &ex_fsm_config);
}
```

(c) "10 second" standby to light_on transition action function. This function implements the tasks defined by the transition from the standby state to the light_on state when the 10 second button is pushed.

```
void standby_to_light_on_10sec_trans_function(void)
{
    fsm_timer1_enable(100, &ex_fsm_config);
}
```

(d) Standby activity function. This function implements the tasks defined by the standby state activity function.

```
void standby_activity_function(void)
{
    turn_light_off( );
}
```

(e) Light_on activity function. This function implements the tasks defined by the light_on state activity function.

```
void light_on_activity_function(void)
{
    turn_light_on( );
}
```

(4) Populate the transition configuration arrays. The definition of the FSM_TRANS_CONFIG_T data type was described earlier.

(a) Standby transition configuration. Based on the diagram, there are two transitions out of the standby state, both of which go to the light_on state. One occurs when the 5 second button is pushed while the other occurs when the 10 second is pushed. The following procedure is used to configure the transition configuration for the standby state:

"5 second" transition to the light_on state

Use the "LIGHT_ON" constant for the target state.

This transition is dependent on five_sec_button_pushed and ten_sec_button pushed so the bits 0 and 1 of the don't care mask value are set to 1. This yields a value of 0x00000003 for the don't care mask value. The bits in the don't care mask correspond to the bit selection in the input word.

In addition, five_sec_button_pushed has to be TRUE and ten_sec_button_pushed has to be FALSE in order to take this transition so bit 0 of the condition mask value is set to 1 and bit 1 is set to 0. This yields a value of 0x00000001 for the condition value. The bits in the condition mask correspond to the bit selection in the input word.

FSM timer1 is enabled for a 5 second timeout during this transition and a standby_to_light_on_5sec_trans_function function is implemented (above) to do this. The address of this function is used for the transition action function address.

"10 second" transition to the light_on state

Use the "LIGHT_ON" constant for the target state.

This transition is dependent on five_sec_button_pushed and ten_sec_button pushed so the bits 0 and 1 of the don't care mask value are set to 1. This yields a value of 0x00000003 for the don't care mask value. The bits in the don't care mask correspond to the bit selection in the input word.

In addition, ten_sec_button_pushed has to be TRUE and five_sec_button pushed has to be FALSE in order to take this transition so bit 0 of the condition mask value is set to 0 and bit 1 is set to 1. This yields a value of 0x00000002 for the condition value. The bits in the condition mask correspond to the bit selection in the input word.

FSM timer1 is enabled for a 10 second timeout during this transition and a standby_to_light_on_10sec_trans_function function is implemented (above) to do this. The address of this function is used for the transition action function address.

```
FSM_TRANS_CONFIG_T standby_trans_config[ ] =
{
```

```
        { LIGHT_ON, 0x00000001, 0x00000003,
    &standby_to_light_on_5sec_trans_function },
        { LIGHT_ON 0x00000002, 0x00000003,
    &standby_to_light_on_10sec_trans_function },
        { FSM_TRANS_END, 0, 0, 0 } /* End marker */
};
```

(b) Light_on transition configuration. Based on the diagram, there is only one transition out of the light_on state and it goes to the standby state.

Transition to the standby state

Use the "STANDBY" constant for the target state.

This transition is dependent on a timeout of FSM timer1, five_sec_button_pushed, and ten_sec_button_pushed so the bits 0, 1, and 31 of the don't care mask value are set to 1. This yields a value of 0x80000003 for the don't care mask value. The bits in the don't care mask correspond to the bit selection in the input word.

In addition, FSM timer1 timeout has to be TRUE, five_sec_button_pushed has to be FALSE, and ten_sec_button_pushed has to be FALSE in order to take this transition so bit 31 of the condition mask value is set to 1, bit 0 is set to 0, and bit 1 is set to 0. This yields a value of 0x80000000 for the condition value. The bits in the condition mask correspond to the bit selection in the input word.

Nothing happens during this transition so no transition action is required.

```
FSM_TRANS_CONFIG_T light_on_trans_config[ ] =
{
    { STANDBY, 0x80000000, 0x80000003, 0 },
    { FSM_TRANS_END, 0, 0, 0 } /* End marker */
};
```

(5) Populate the state configuration array. The definition of the FSM_STATE_CONFIG_T data type was described previously in this document. The value of the STANDBY constant is 0 and LIGHT_ON constant is 1. This means that index 0 in the state configuration array must be used for the standby state and index 1 in the state configuration array must be used for the light_on state.

```
FSM_STATE_CONFIG_T state_config[ ] =
{
    { /* standby state config */
    0, /* no entry action so use 0 */
    &standby_activity_function, /* point at the activity function implemented above */
    0, /* no exit action so use 0 */
    &standby_trans_config[0] /* point at the transition configuration populated above */
    },
    { /* light_on state config */
    0, /* no entry action so use 0 */
    &light_on_activity_function, /* point at the activity function implemented above */
    0, /* no exit action so use 0 */
    &light_on_trans_config[0] /* point at the transition configuration populated above */
    },
};
```

(6) Populate the main configuration. The definition of the FSM_CONFIG_T data type was described previously in this document. Assume the name of the workspace variable is "workspace."

```
FSM_CONFIG_T main_config =
{
    STANDBY, /* initial state */
    &transition_input_word, /* point at the transition input word */
    &state_config, /* point at the state configuration array populated above */
    &workspace, /* point at the workspace variable */
    &process_inputs_function, /* point at the process inputs function implemented above */
    0 /* no powerup transition function so use 0 */
};
```

While the present invention has been described with reference to a particular preferred embodiment and the accompanying drawings, it will be understood by those skilled in the art that the invention is not limited to the preferred embodiment and that various modifications and the like could be made thereto without departing from the scope of the invention as defined in the following claims.

What is claimed is:

1. A method for implementing a configurable state machine, comprising the steps of:
    determining a state machine diagram for a desired state machine;
    allocating a RAM variable for an input word;
    assigning transition condition bits in said input word;
    implementing an input word processing function;
    allocating a state machine workspace structure in RAM;
    configuring said state machine by creating a list of states and corresponding constant values and allocating and populating a state machine configuration structure;
    calling, at initialization, a configurable state machine reentrant initialization function passing an address of said state machine configuration; and
    calling periodically a configurable state machine reentrant processing function passing said address of said state machine configuration.

2. A method according to claim 1, further comprising the step of calling up, as needed, from within the implemented state machine, a first timer enabling function to enable a first timer for said configurable state machine.

3. A method according to claim 2, further comprising the step of calling up, as needed, from within the implemented state machine, a first timer timeout function to assign a timeout to said first timer.

4. A method according to claim 2, further comprising the step of calling up, as needed, from within the implemented state machine, a first timer disabling function to disable said first timer.

5. A method according to claim 4, further comprising the step of calling up, as needed, from within the implemented state machine, a second timer enabling function to enable a second timer for said configurable state machine.

6. A method according to claim 5, further comprising the step of calling up, as needed, from within the implemented state machine, a second timer timeout function to assign a timeout to said second timer.

7. A method according to claim 5, further comprising the step of calling up, as needed, from within the implemented state machine, a second timer disabling function to disable said second timer.

8. A method according to claim 5, further comprising the step of calling up, as needed, from within the implemented state machine, a second timer pausing function to pause said second timer without disabling said second timer.

9. A method according to claim 8, further comprising the step of calling up, as needed, from within the implemented state machine, a second timer starting function to start said second timer after said second timer is paused with said second timer pausing function.

10. A method according to claim 5, further comprising the step of calling up, as needed, from within the implemented state machine, a second timer elapsed time function to provide a timer value for said second timer.

11. A method according to claim 2, further comprising the step of calling up, as needed, from within the implemented state machine, a first timer pausing function to pause said first timer without disabling said first timer.

12. A method according to claim 11, further comprising the step of calling up, as needed, from within the implemented state machine, a first timer starting function to start said first timer after said first timer is paused with said first timer pausing function.

13. A method according to claim 2, further comprising the step of calling up, as needed, from within the implemented state machine, a first timer elapsed time function to provide a timer value for said first timer.

14. A method according to claim 1, further comprising the step of calling up, as needed, a current state function to provide a current state of said state machine.

15. A method according to claim 1, further comprising the step of calling up, as needed, from within the implemented state machine, a function to override transition race condition protection within said state machine.

16. A method for implementing a configurable state machine, comprising the steps of:
    determining a state machine diagram for a desired state machine; generating configuration data based on said state machine diagram; and
    feeding said configuration data to said configured configurable state machine to obtain implementation of said desired state machine; and
    where said configurable state machine provides one or more timer related functions and where said one or more timer related functions are implemented within said configurable state machine.

17. An article of manufacture including a computer useable medium having computer readable program code means embodied therein for causing implementation of a configurable state machine, the computer readable program code means in said article of manufacture comprising:
    a first computer readable program code means for causing a computer to effect generation configuration data based on a state machine diagram corresponding to a desired state machine;
    a second computer readable program code means for causing a computer to effect feeding said configuration data to said configured configurable state machine to obtain implementation of said desired state machine; and
    where said configurable state machine provides one or more timer related functions and where said one or more timer related functions are implemented within said configurable state machine; and
    where said timer related functions include the determination of an elapsed time after starting and before the expiration of a timer.

18. A program storage device readable by a machine, tangibly embodying a program of instructions executable by a machine to perform method steps for implementing a configurable state machine, said method steps comprising:
    generating configuration data based on a state machine diagram corresponding to a desired state machine;
    feeding said configuration data to said configured configurable state machine to obtain implementation of said desired state machine; and
    where said configurable state machine provides one or more timer related functions and where said one or more timer related functions are implemented within said configurable state machine.

* * * * *

UNITED STATES PATENT AND TRADEMARK OFFICE
CERTIFICATE OF CORRECTION

PATENT NO. : 7,039,893 B2
APPLICATION NO. : 10/166924
DATED : May 2, 2006
INVENTOR(S) : Lee Roger DenBraber It is certified that error appears in the above-identified patent and that said Letters Patent is hereby corrected as shown below:

Col. 7, l. 64, change "Void   Fsm_" to read -- Void Fsm_ --.
Col. 7, l. 64, change "unsigned   32" to read -- unsigned 32 --.
Col. 8, l. 30, change "Void   Fsm_" to read -- Void Fsm_ --.
Col. 8, l. 30, change "unsigned   32" to read -- unsigned 32 --.
Col. 27, l. 38, claim 5, delete "4" replace with -- 2 --.
Col. 27, ll. 40-41, claim 5, delete "second timer enabling function to enable a second timer for said configurable state machine." Replace with -- first timer pausing function to pause said first timer without disabling said first timer. -- .
Col. 27, ll. 44-45, claim 6, delete "second timer timeout function to assign a timeout to said second timer." Replace with -- first timer starting function to start said first timer after said first timer is paused with said first timer pausing function. --.
Col. 27, l. 46, claim 7, delete "5" and replace with -- 2 --.
Col. 27, ll. 48-49, claim 7, delete "second timer disabling function to disable said second timer." Replace with -- first timer elapsed time function to provide a timer value for said first timer. --.
Col. 27, l. 50, claim 8, delete "5" replace with -- 4 --.
Col. 27, ll. 52-53, claim 8, delete "pausing function to pause said second timer without disabling said second timer." Replace with -- enabling function to enable a second timer for said configurable state machine. --.
Col. 27, ll. 56-58, claim 9, delete "starting function to start said second timer after said second timer after said second timer is paused with said second timer pausing function." Replace with -- timeout function to assign a timeout to said second timer. --.
Col. 27, l. 59, claim 10, delete "5" replace with -- 8 --.
Col. 27, ll. 61-62, claim 10, delete "elapsed time function to provide a timer value for said second timer." Replace with -- disabling function to disable said second timer. --.
Col. 27, l. 63, claim 11, delete "2" replace with -- 8 --.
Col. 27, ll. 65-66, claim 11, delete "first timer pausing function to pause said first timer without disabling said first timer." Replace with -- second timer pausing function to pause said second timer without disabling said second timer. --.
Col. 28, ll. 3-5, claim 12, delete "first timer starting function to start said first timer after said first timer is paused with said first timer pausing function." Replace with -- second timer starting function to start said second timer after said second timer is paused with said second timer pausing function. --.
Col. 28, l. 6, claim 13, delete "2" replace with -- 8 --.

UNITED STATES PATENT AND TRADEMARK OFFICE
CERTIFICATE OF CORRECTION

PATENT NO.         : 7,039,893 B2
APPLICATION NO. : 10/166924
DATED              : May 2, 2006
INVENTOR(S)        : Lee Roger DenBraber It is certified that error appears in the above-identified patent and that said Letters Patent is hereby corrected as shown below:

Col. 28, ll. 8-9, claim 13, delete "first timer elapsed time function to provide a timer value for said first timer." Replace with -- second timer elapsed time function to provide a timer value for said second timer. --.

Signed and Sealed this

Eleventh Day of November, 2008

JON W. DUDAS
*Director of the United States Patent and Trademark Office*